United States Patent [19]

Keeley

[11] Patent Number: 5,487,163

[45] Date of Patent: Jan. 23, 1996

[54] FAST SYNCHRONIZATION OF ASYNCHRONOUS SIGNALS WITH A SYNCHRONOUS SYSTEM

[75] Inventor: James W. Keeley, Nashua, N.H.

[73] Assignee: Bull HN Information Systems Inc., Billerica, Mass.

[21] Appl. No.: 148,030

[22] Filed: Nov. 4, 1993

Related U.S. Application Data

[63] Continuation of Ser. No. 593,438, Oct. 5, 1990, abandoned.

[51] Int. Cl.$^6$ ............................. H03K 5/13; H03K 5/135; H03K 19/003
[52] U.S. Cl. .................. 395/550; 326/94; 364/DIG. 1; 364/270.9; 364/DIG. 2; 364/950; 364/950.1
[58] Field of Search ......................... 395/550; 307/443; 326/94; 327/198

[56] References Cited

U.S. PATENT DOCUMENTS

| | | | |
|---|---|---|---|
| 4,929,850 | 5/1990 | Breuninger | 307/443 |
| 4,999,528 | 3/1991 | Keech | 307/279 |
| 5,036,221 | 7/1991 | Brucculeri et al. | 307/443 |
| 5,047,658 | 9/1991 | Shrock et al. | 307/269 |

OTHER PUBLICATIONS

Horstmann et al., IEEE Journal of Solid-State Circuits, "Metastability Behavior of CMOS ASIC Flip–Flops", Feb. 1989 v.24 No. 1, pp. 146–157.
Comer, "Digital Logic & State Machine Design", N.Y. 1984 pp. 219–331 and 353–354.
Fleischhammer et al. "The Anomalous Behavior of Flip–Flops in Synchronize Circuits", IEEE 1979, pp. 273–276.
Beaston et al. "Designer Confront Metastability in Boards and Buses" Computer Design, 1986 pp. 67–71.
Browns "Control Metastability in High–Speed CMOS Circuits", Electronic Design, 1991 pp. 74–80.
Patterson D. A., "Computer Architecture—A Quantitative Approach", Calif. 1990 pp. 253–255.

*Primary Examiner*—Thomas C. Lee
*Assistant Examiner*—D. Dinh
*Attorney, Agent, or Firm*—Faith F. Driscoll; John S. Solakian

[57] ABSTRACT

A method and apparatus provides fast synchronization of asynchronous signals to use by a synchronously operated device by quantizing the delay of an input clocked bistable device which receives and stores the asynchronous signal in response to a first synchronous clock pulse so that such input clocked bistable device has a metastable time period which is less than a predetermined maximum delay period. The output signal of the input clocked bistable device is connected directly to as an input to an asynchronously operated logic circuit part selected to provide a resulting output signal corresponding to the result of performing a logical operation on the output signal within a predetermined minimum time period. The resulting output signal is directly applied to the input of another synchronously operated bistable device which stores the resulting output signal in response to the next occurring synchronous clock pulse corresponding to a time period which is greater than the time of the metastable time period, minimum delay of the logic part and preset of time of such bistable device.

12 Claims, 1 Drawing Sheet

FAST SYNCHRONIZATION OF ASYNCHRONOUS SIGNALS WITH A SYNCHRONOUS SYSTEM

This is a continuation of application Ser. No. 07/593,438, filed on Oct. 5, 1990, now abandoned.

BACKGROUND OF THE INVENTION

1. Field of Use

The present invention relate to synchronizing apparatus and more particularly to apparatus and methods for synchronizing asynchronously arranging bus signals with the operations of a synchronously operated processing unit.

2. Prior Art

A well known method of synchronization is to provide duplicated or cascaded bistable devices which are characterized by metastable operation for synchronizing asynchronous input signals with the operations of a processing unit prior to performing any operations on such asynchronous input signals. The term "metastable operation" refers to the prolonged transition time of a bistable device that may result if the input which causes the bistable device to change state is marginal in certain respects (e.g. width). The marginal input leaves the bistable device in a "metastable state" that is between the two stable states where it may remain for an indefinite time period before assuming one of the two strobe states. In synchronous systems, metastable operation is of great importance in that in such systems, the inputs to these systems must be synchronized to the clock units of such systems. If this is not done, then state register inputs may change during intervals when they should be constant. As a result, some state register flip-flops may respond to the old input value and others to the new input value.

Accordingly, the above duplication approach of using two cascaded flip-flops has been used to overcome this problem. That is, it is well known to lengthen the cascade of flip-flops which perform as input synchronizers. It is also possible to lengthening the clock pulse repetition time of the clock signals produced by a system's clock unit. However, the reliability is achieved at the expense of speed. It becomes particularly important to provide both reliable and high speed operation within processing units which operate in a pipelined mode of operation. In such units, the loss of a cycle can substantially reduce the performance of such units in that instruction execution is required to be completed within a cycle of operation.

Accordingly, it is a primary object of the present invention to provide an improved synchronization method and apparatus.

It is a further object of the present invention to provide an improved synchronization technique which minimizes the number of circuit elements to implement.

SUMMARY OF THE INVENTION

The above and other objects of the present invention are achieved in a preferred embodiment of a synchronization system which includes an input clocked bistable device which receives and stores an indication of an asynchronous signal in response to a first clock pulse generated by a clock unit included within a processing unit. The input bistable device is selected to have a metastable time period which is less than a predetermined maximum delay period. The output signal of the bistable device is directly connected as one input to an asynchronously operated logic circuit element which is selected to have a predetermined minimum time period for providing an output result signal in response to an input signal. The result signal is directly applied as an input to a synchronously operated output bistable device which stores the result signal in response to the next occurring synchronous clock pulse so as to provide a stable state output signal within a time period which is defined by the sum of the metastable time period, predetermined minimum time period and preset time of the output bistable device.

The above system eliminates the need to provide a second cascaded flip-flop thereby saving one clock period or cycle within the synchronously operated system.

The novel features which are believed to be characteristic of the invention both as to its organization and method of operation, together with further objects and advantages, will be better understood from the description in the following section when considered in connection with the accompanying drawings described in this section. It is to be expressly understood, however, that each of the drawings is given for the purpose of illustration only and is not intended as a definition of the limits of the present invention.

DETAILED DESCRIPTION OF THE PREFERRED EMBODIMENT

Figure 1:
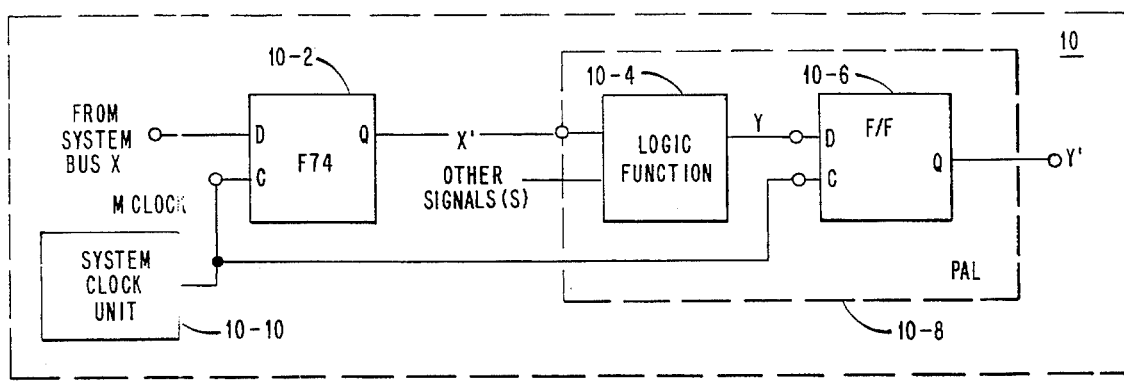
FIG. 1 is a block diagram of a system which incorporates the method and apparatus of the present invention.

FIG. 1 is a block diagram of a system for synchronizing asynchronous bus signals with the operations of a synchronously operated processing unit. As shown in FIG. 1, the system 10 includes an input clocked bistable device 10-2 whose binary ONE output terminal (Q) directly connects to one input terminal of a logic circuit 10-4, as shown. The output terminal of logic circuit 10-4 directly connects to the data input (D) of a second clocked bistable device 10-6. The clock input terminals (C) of both bistable devices 10-2 and 10-6 are connected to the output of a synchronous clock unit 10-8. The clock unit 10-8 provides clock pulses at a predetermined clock repetition rate. These pulses are distributed throughout a high performance pipelined processing unit for enabling it to execute each instruction within a cycle of operation. In the preferred embodiment, clock unit 10-8 produces clock pulses having a 35 nanosecond period.

In accordance with the teachings of the present invention, bistable device 10-2 is selected to have a metastable operation time characteristic which is less than a predetermined maximum delay period. This period, which is on the order of 18 nanoseconds, is determined by testing the bistable device in a conventional manner. In the preferred embodiment, bistable device 10-2 may take the form .of the D-type flip-flop designated by part number 74F74, manufactured by Fairchild Semiconductor Corporation.

The logic circuit 10-4 is asynchronously operated, and the bistable device 10-6 is a synchronous clocked D-type flip-flop. In the preferred embodiment, both the logic circuit 10-4 and device 10-6 are constructed from a single programmable array logic (PAL) circuit labeled 10-8 in FIG. 1 which is designated by part number 22V10-15, manufactured by Lattice Semiconductor Corporation. The PAL circuit is known to have a maximum delay of 12 nanoseconds. As shown, PAL circuit 10-4 also includes other input terminals which are normally connected to receive signals from other portions of system 10. The circuit 10-8 can be programmed in a conventional manner to perform a combinatorial logic operation on the input signals to produce an output result signal Y.

DESCRIPTION OF OPERATION

Figure 2:
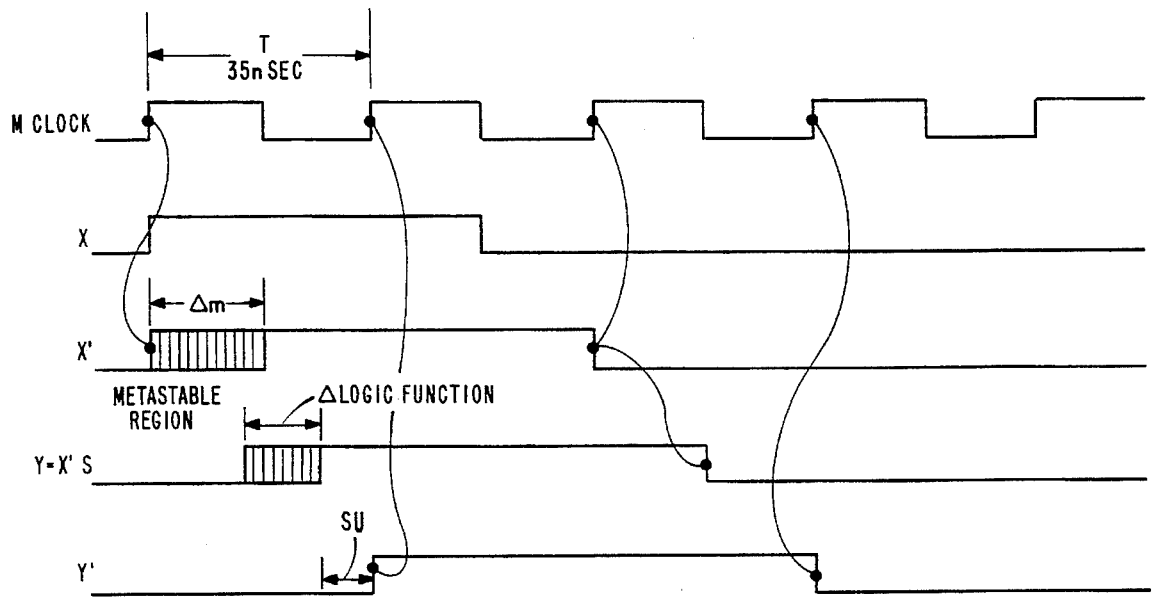
FIG. 2 is a timing diagram used to describe the operation of the present invention.

With reference to FIG. 1, the operation of system 10 will now be described with reference to the timing diagram of FIG. 2. As shown, clock unit 10—10 provides a clock signal MCLOCK having a period of T nanoseconds (e.g. 30–35 nanoseconds). Signal X is an asynchronous signal which may be received or derived from an asynchronous source, such as a system bus. The system bus may take the form of the asynchronous bus system disclosed in U.S. Pat. No. 4,901,226.

The signal X is clocked into bistable device 10-2 on the leading edge of signal MCLOCK. This causes the bistable device 10-2 to generate output signal $X^1$ which has a metastable state or region of operation. The metastable state endures for the time period designated as $\Delta m$ in FIG. 2. The metastable time period $\Delta m$ is selected according to its mean time between failure (MTBF) characteristic. For reliable operation, the MTBF value for time period $\Delta m$ should be equal to or greater than the MTBF value for flip-flop 10-2 (i.e., MTBF for that component).

The metastable output signal is applied to one input terminal of the logic function portion 10-4 of PAL circuit 10-8. In response to metastable signal $X^1$ and input signals (S) applied to other input terminals, circuit 10-4 internally generates the result logic signal Y having the metastable characteristic shown in FIG. 2.

It is assumed for ease of explanation, the circuit 10-4 performs an AND operation on the input signals $X^1$ and (S). At the end of the time interval T, a second clock pulse of signal MCLOCK is applied to the bistable device portion 10-6 of PAL circuit 10-8. This pulse loads the state of result signal Y into bistable device 10-6 which causes its output terminal (Q) to switch state after a setup (preset) time interval. This produces the stable state output signal $y^1$ in FIG. 2. Thus, the time interval T can be defined by the following equation:

$$T = \Delta m + \Delta L + SU + CS \text{ where}$$

$\Delta m$=max acceptable metastable delay;

$\Delta L$=delay of logic function;

SU=setup time of flip-flop 10-6; and

CS=clock skew delay produced by differences in clocking signals when separate clock sources are used for clocking flip-flops 10-2 and 10-6.

For reliable operation, the time interval T should be no smaller than that defined by the above equation.

It can been seen from the above that by the time of the occurrence of a next clock pulse, the PAL circuit 10-4 is able to produce a result output signal which is no longer metastable and can be clocked into a further bistable device resulting in a stable state synchronized output signal. This eliminates not only an additional storage device, but reduces eliminates an extra clock cycle of operation. The result is a corresponding increase in processing unit performance.

Many changes may be made to the preferred method and apparatus of the present invention. For example, different types of PAL devices may be used. Also, separate PAL devices and separate flip-flops may be used to construct elements 10-4 and 10-6. Additionally, the elements 10-2 and 10-6 may be driven from different clock units, in which case the time interval T will include a clock skew delay value as indicated in the above equation.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A method of synchronizing an asynchronous bilevel input signal with the operations of a synchronously operated unit which is resilient to metastability wherein operations of said unit are timed by clocking signals which have leading and trailing edges and a predetermined clock time period between successive clocking signals and said successive clocking signals being generated by a timing unit within said unit, said method including the steps performed within said synchronously operated unit of:

(a) establishing a clock frequency having said predetermined clock time period:

(b) storing the state of said asynchronous bilevel input signal directly applied to a data input terminal of a first clocked bistable device having a clock input terminal directly connected to receive said clocking signals from said timing unit in response to said leading edge of a first one of said clocking signals;

(c) selecting said first clocked bistable device to have a metastable time delay period which is less than a predetermined maximum delay period;

(d) selecting a programmable logic circuit which has a logic time delay and setup delay period whose sum is no greater than said predetermined clock time period minus said metastable time period;

(e) directly applying a metastable output signal representative of said state generated by said first clocked bistable device at an output terminal of said first clocked bistable device as a result of having stored said asynchronous input signal in response to said leading edge of said first one of said clocking signals which occurs in close proximity to the time occurrence of a transition in level in said asynchronous bilevel input signal, to one input of said programmable logic circuit element having a plurality of input terminals and at least one output terminal, said programmable logic circuit element having an asynchronously operated logic section selected as having a predetermined minimum time delay period for providing an output result signal in response to an input signal generated within said unit and a synchronously operated register section having a number of synchronously operated clocked bistable devices;

(f) applying at least one input logic signal to another one of said plurality of input terminals of said programmable logic circuit element for generating said output result signal by performing a programmed one of a predetermined set of logical operations on said metastable output signal and said one input logic signal; and, (g) programming said programmable logic circuit element for directly applying said output result signal as an input to one of said number of said synchronously operated clocked bistable devices directly connected to said timing unit to receive said clocking signals for storing said result signal in response to said leading edge of the clocking signal following said first one of said clocking signals so as to provide a stable output signal at said output terminal after said setup time delay period of said one clocked bistable device within said predetermined clock time period which corresponds to the sum of said metastable time delay period, said logic time delay period and said setup time delay period so as to produce a valid stable output at said output terminal synchronized with said timing unit within a maximum of two clock periods notwithstanding occurrences of said metastability.

2. The method of claim 1 wherein said metastable time delay period and said first clocked bistable device, each has a predetermined mean time between failure (MTBF) value and wherein said method further includes the step of selecting the MTBF value for said predetermined maximum time delay to be equal to or greater than the MTBF value of said first clocked bistable device for maximum reliable operation.

3. The method of claim 1 wherein said timing unit includes two clock circuits and wherein said method further includes the steps of:

(a) connecting the output of one clock circuit for directly applying clocking signals to said first clocked bistable device; and, (b) connecting the output of another clock circuit for directly applying clocking signals to said programmable logic circuit for application to said number of synchronously operated bistable clocked bistable devices wherein said predetermined clock time period between successive clocking signals provided by said two clock circuits is defined to be no greater than the sum of said metastable time period, said logic time delay period and said setup time period and a clock skew delay corresponding to an amount of clock skew between said clock signals applied to said first bistable device and said number of synchronously operated devices of said programmable logic circuit.

4. A synchronizer device which is resilient to metastability for generating a resulting combinatorial logic signal from an asynchronous bilevel signal received from an asynchronously operated source and a number of logic signals generated within a synchronous processing unit operating under the control of clocking signals having leading and trailing edges and a predetermined clock period generated by a timing source included in said processing unit, said device comprising:

a first clocked bistable device having a data input terminal directly connected to receive said asynchronous signal, a clock input terminal directly connected to receive each of said clocking signals from said timing source and an output terminal, said first clocked bistable device in response to said leading edge of a first one of said clocking signals occurring in close proximity to the time of occurrence of a transition in level in said asynchronous bilevel signal in storing the state of said asynchronous signal and producing at said output terminal, a metastable output signal selected as having a metastable time period which is less than a predetermined maximum delay;

an asynchronous programmable logic circuit element having a plurality of input terminals and at least one output terminal, said programmable logic circuit element selected as having a logic delay time period and a predetermined minimum time delay period, one of said plurality of input terminals being directly connected to said output terminal of said first clocked bistable device for receiving said metastable output signal and at least another input terminal being connected to receive one of said number of logic signals, said asynchronous combinatorial programmable logic circuit element generating at said one output, an output result signal produced by performing a combinatorial logic operation on said metastable output signal and said one of said number of logic signals; and, a second clocked bistable device included in said programmable logic circuit element which has a predetermined setup time delay period, said second clocked bistable device having a data input terminal, a clock input terminal, and a data output terminal, said data input terminal being directly connected to said output terminal of said combinatorial programmable logic circuit element, said clock input terminal being directly connected to said timing source to receive said clocking signals, said second bistable device in response to said leading edge of a next successive clocking signal, storing said result signal and producing a stable output signal notwithstanding any metastability at said output terminal synchronized with said timing unit coresoponding to said resulting combinatorial logic signal within said predetermined clock period which minus said metastable time delay period is no less in duration than the sum of said logic delay time period and said setup delay period.

5. The device of claim 4 wherein said logic element and said second clocked bistable device is included in a single programmable array logic (PAL) element.

6. The device of claim 4 wherein said timing source includes a pair of clock circuits, one of said clock circuits being directly connected to said clock input of said first bistable device for applying said clocking signals and another of said clock circuits being directly connected to said clock input of said second bistable device for applying said clocking signals thereby resulting in said predetermined clock period which is no greater than the sum of said predetermined maximum time delay, said predetermined minimum time delay period, said setup time delay period and a clock skew delay corresponding to any differences between said first and second clocking signals.

7. The device of claim 4 wherein said first and second clocked bistable devices are D-type flip-flops.

8. Apparatus for synchronizing a bilevel asynchronous input signal with the operation of a synchronous progressing unit, wherein said processing unit is operated synchronously by causing changes of state therein to be controlled by and in-synchronism with the pulses of a clock signal of constant frequency and predetermined repetition time generated by a timing unit of said processing unit, said apparatus comprising:

a first clocked flip-flop having a data input terminal directly coupled to receive said asynchronous input signal, a clock input terminal directly coupled to receive said clock signal, and an output terminal, said first clocked flip-flop having a predetermined selected metastability characteristic which produces a metastable time period less than a predetermined maximum delay period when said first clocked flip-flop enters a metastable state, said first flip-flop, at the time of occurrence of the leading edge of each clock signal pulse received thereby, normally capturing and storing the level of said asynchronous input signal, said storing immediately following said leading edge, and said first flip-flop, at the time the leading edge of a clock signal pulse received thereby occurs in close proximity to the time of occurrence of a transition in the level of said asynchronous input signal, entering said metastable state;

a logic circuit element having at least two input terminals and an output terminal, a logic delay time period and a selected minimum delay characteristic, a first of said input terminals of said logic circuit element being coupled to the output terminal of said first clocked flip-flop and a second of said input terminals of said logic circuit element being coupled to receive a bilevel input signal, said logic circuit element generating an output signal at said output terminal thereof representing a logical combination of the signals received at said first and second input terminals thereof; and a second clocked flip-flop having a data input terminal coupled to receive said output signal generated by said logic circuit element, a clock input terminal coupled to receive said clock signal, and an output terminal, said second flip-flop, at the time of occurrence of the leading edge of each clock signal pulse received thereby, capturing and storing the level of the signal received at the data input terminal thereof, said storing immediately following said leading edge;

said timing unit generating said clock signal pulses with said predetermined repetition period which minus said metastable time period is no less in duration than the sum of: (i) the logic delay time of said logic circuit element and (ii) the setup time of said second clocked flip-flop.

9. The apparatus of claim 8, wherein said clock signal pulses received at the respective clock input terminals of said first and second clocked flip-flops arrive with a skew time between corresponding pulses; and wherein said repetition period is no less in duration than the sum of:

(i) the duration of said metastable state, (ii) the delay time of said logic circuit element, and (iii) the setup time of said second clocked flip-flop, adjusted for said skew time.

10. The apparatus of claim 8, wherein said first clocked flip-flop has a mean time between failure (MTBF) value less than or equal to the MTBF value of said duration of said metastable state.

11. The apparatus of claim 8, wherein said logic circuit element and said second clocked flip-flop are formed in a single programmable array logic member.

12. A method of synchronizing a bilevel asynchronous processing unit, wherein said synchronous processing unit comprises (i) first and second clocked flip-flops, each of said clocked flip-flops having a data input terminal for receiving a bilevel input signal, a clock input terminal for receiving clock signal pulses of constant frequency and predetermined time period, and an output terminal, said clocked flip-flops, at the time of occurrence of the leading edge of each clock signal pulse received thereby, normally capturing and storing the level of the signal applied to the data input terminal thereof, said storing immediately following said leading edge, and said first clocked flip-flop, at the time the leading edge of a clock signal pulse received thereby occurs in close proximity to the time of occurrence of a transition in the level of said asynchronous input signal: entering a metastable state; and (ii) a logic circuit element generating a signal at the output terminal thereof representing a logical combination of signals received at said input terminals thereof; said method comprising the steps of:

(a) directly applying said asynchronous input signal to said data input terminal of said first clocked flip-flop selected as having a predetermined metastability characteristic which produces a metastable time period less than a predetermined maximum delay period when said first clocked flip-flop enters said metastable state;

(b) directly applying the signal delivered at the output terminal of said first clocked flip-flop to a first of said input terminals of said logic circuit element;

(c) applying a bilevel input signal to a second of said input terminals of said logic circuit element having a logic delay time and selected to have a predetermined minimum delay time;

(d) directly applying the signal delivered at the output terminal of said logic circuit element to said data input terminal of said second clocked flip-flop; and, (e) applying said clock signal pulses to said clock input terminals of said clocked flip-flops at a repetition rate whose period corresponds to said predetermined time period which minus said metastable time period is no less in duration than the sum of: (i) the logic delay time of said logic circuit element and (ii) the setup time of said second flip-flop.

* * * * *